(12) United States Patent
Ehrenpfordt et al.

(10) Patent No.: US 8,981,499 B2
(45) Date of Patent: Mar. 17, 2015

(54) MEMS CHIP PACKAGE AND METHOD FOR MANUFACTURING AN MEMS CHIP PACKAGE

(71) Applicant: Robert Bosch GmbH, Stuttgart (DE)

(72) Inventors: Ricardo Ehrenpfordt, Korntal-Muenchingen (DE); Mathias Bruendel, Stuttgart (DE); Andre Gerlach, Leonberg-Hoefingen (DE); Christina Leinenbach, Karlsruhe (DE); Sonja Knies, Rutesheim (DE); Ando Feyh, Palo Alto, CA (US); Ulrike Scholz, Korntal (DE)

(73) Assignee: Robert Bosch GmbH, Stuttgart (DE)

( * ) Notice: Subject to any disclaimer, the term of this patent is extended or adjusted under 35 U.S.C. 154(b) by 36 days.

(21) Appl. No.: 13/683,229

(22) Filed: Nov. 21, 2012

(65) Prior Publication Data

US 2013/0126992 A1    May 23, 2013

(30) Foreign Application Priority Data

Nov. 22, 2011 (DE) .......................... 10 2011 086 764

(51) Int. Cl.
*B81B 3/00* (2006.01)
*B81C 1/00* (2006.01)
*B81B 7/00* (2006.01)

(52) U.S. Cl.
CPC ........... *B81B 3/0067* (2013.01); *B81C 1/00325* (2013.01); *B81B 7/0061* (2013.01); *B81C 1/0023* (2013.01); *B81B 2201/0257* (2013.01)
USPC .......................................... 257/415; 257/416

(58) Field of Classification Search
CPC ......................... B81B 3/0067; B81C 1/00325
USPC .................................................. 257/415–416
See application file for complete search history.

(56) References Cited

U.S. PATENT DOCUMENTS 7,550,828 B2    6/2009    Ramakrishna et al.

FOREIGN PATENT DOCUMENTS

DE    10 2005 055 478 A1    5/2007
DE    10 2009 042 191 A1    1/2011

*Primary Examiner* — Tran Tran
(74) *Attorney, Agent, or Firm* — Maginot, Moore & Beck LLP

(57) ABSTRACT

A MEMS chip package includes a first chip, a second chip, a first coupling element, and a first redistribution layer. The first chip has a first chip surface and a second chip surface, which is opposite the first chip surface. The second chip has a first chip surface and a second chip surface, which is opposite the first chip surface. The first coupling element couples the first chip surface of the second chip to the first chip surface of the first chip, so that a first cavity is defined between the first chip and the second chip. The first redistribution layer is mounted on the second chip surface of the second chip and is configured to provide contact with a substrate.

11 Claims, 10 Drawing Sheets

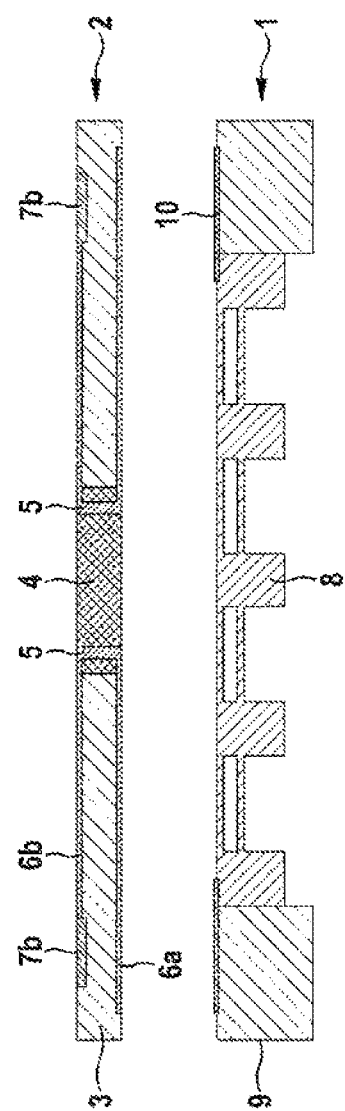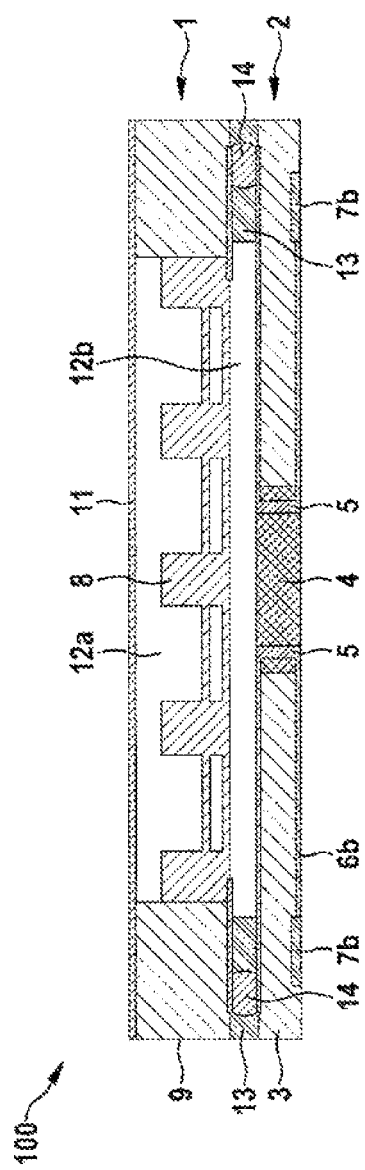

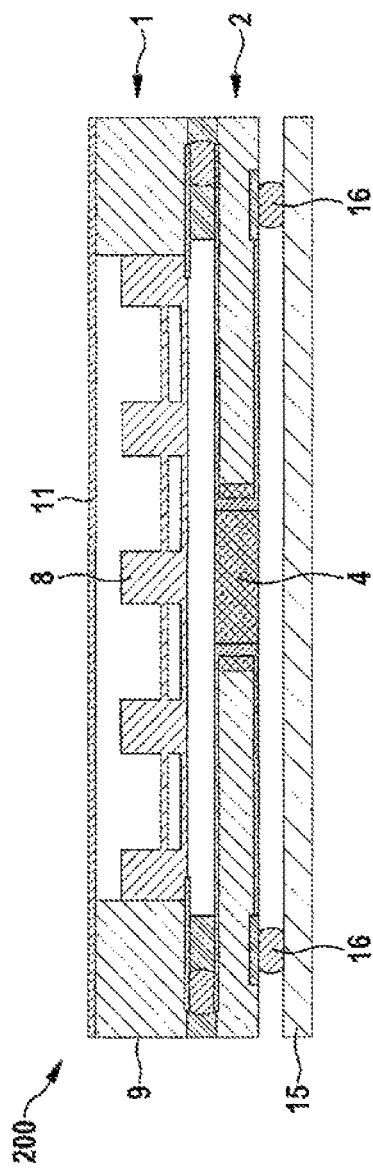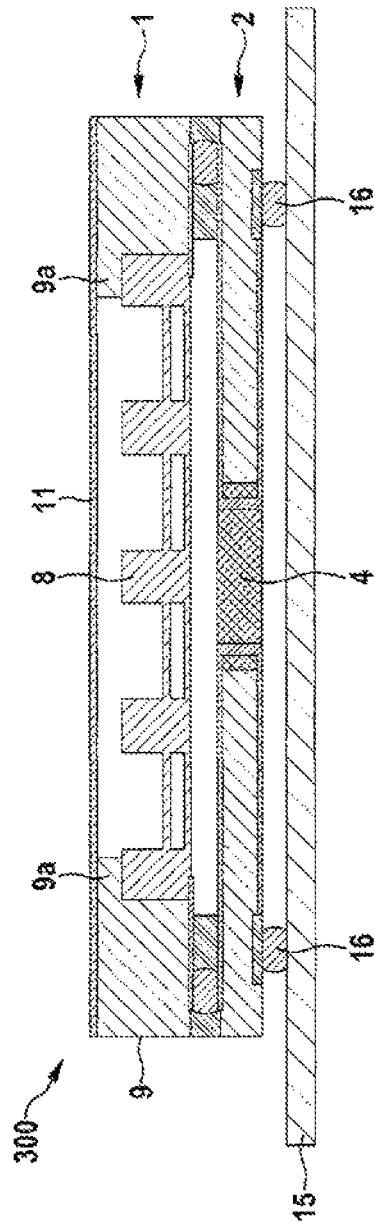

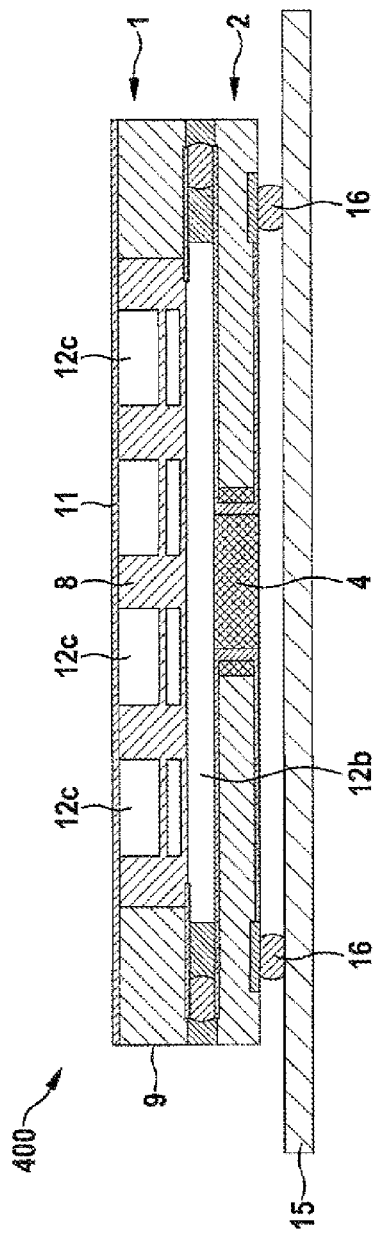
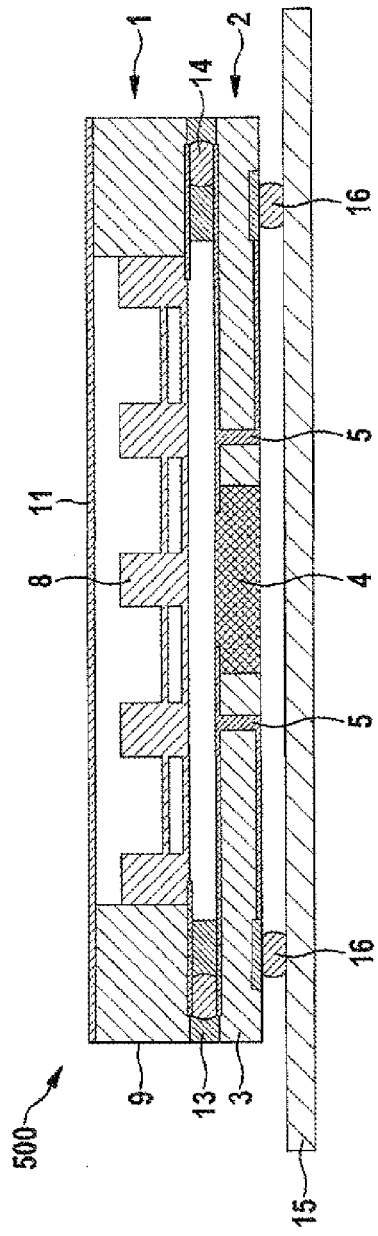

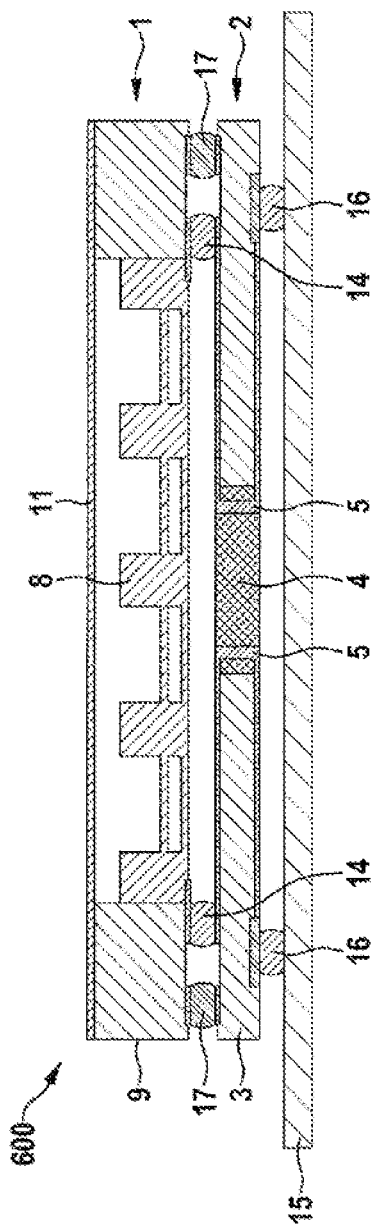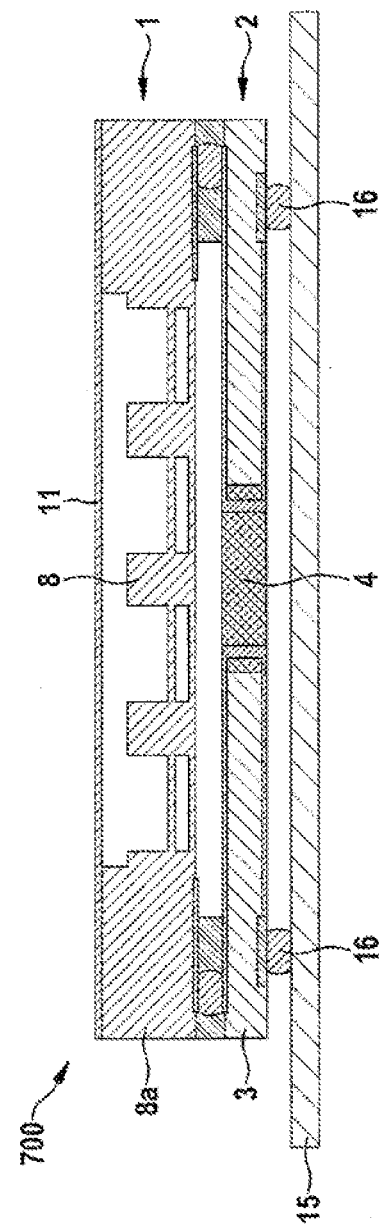

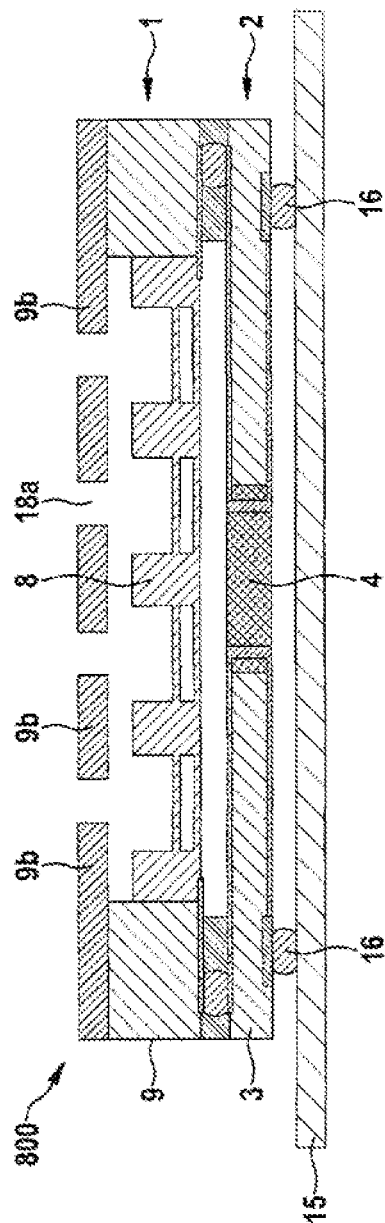

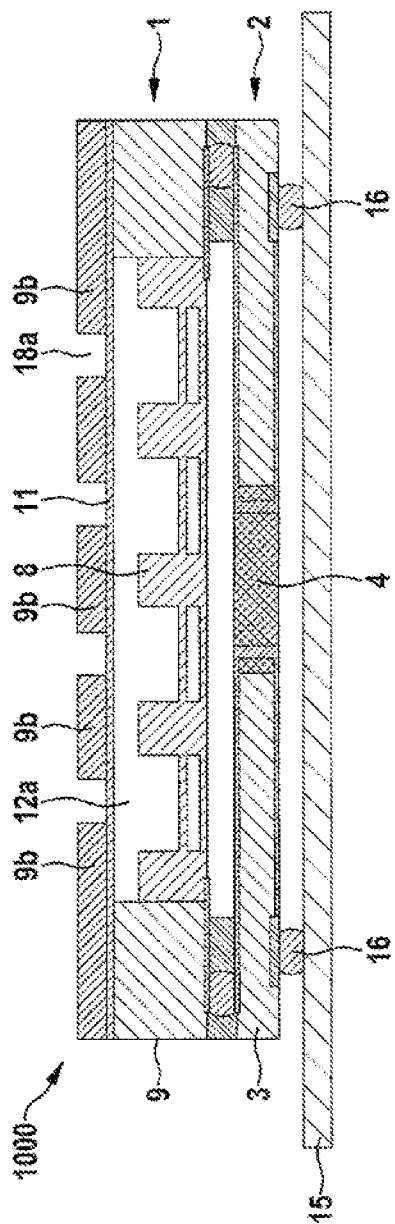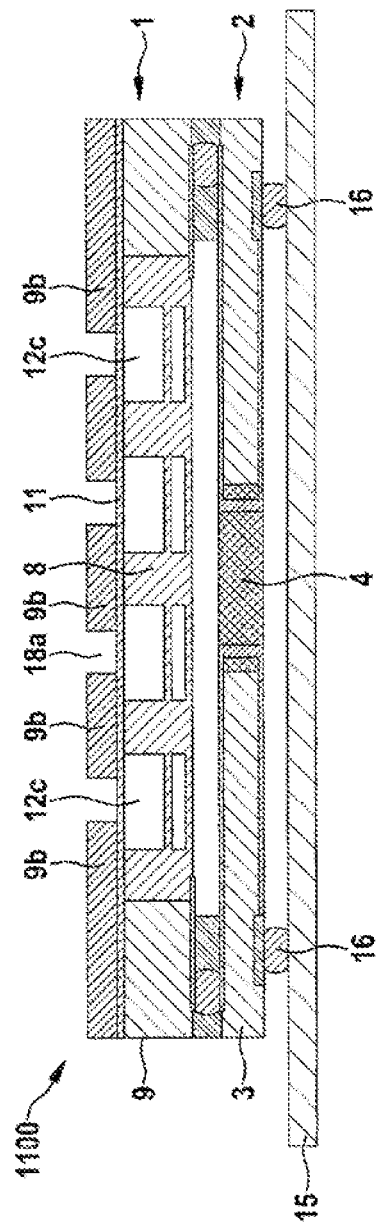

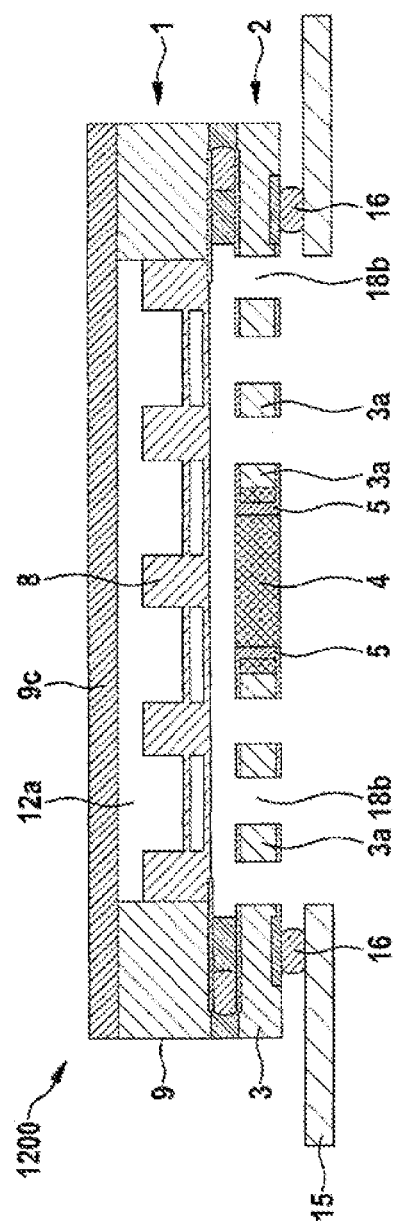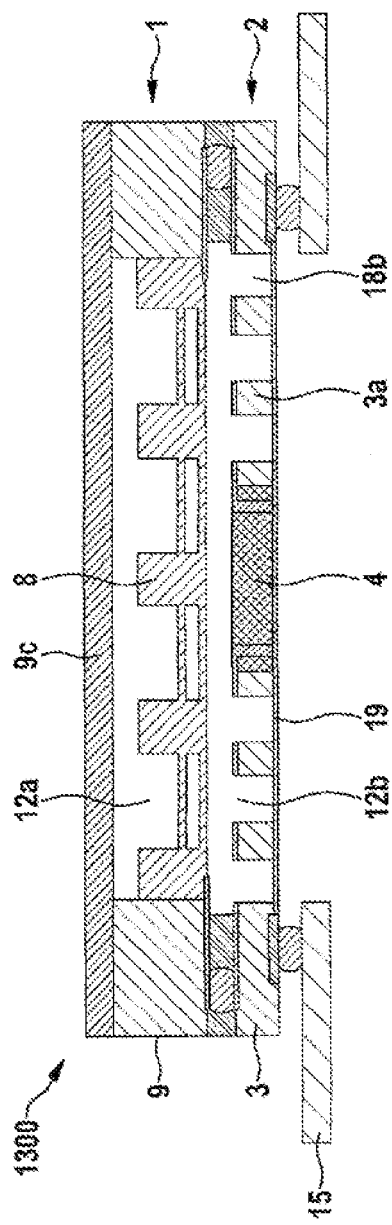

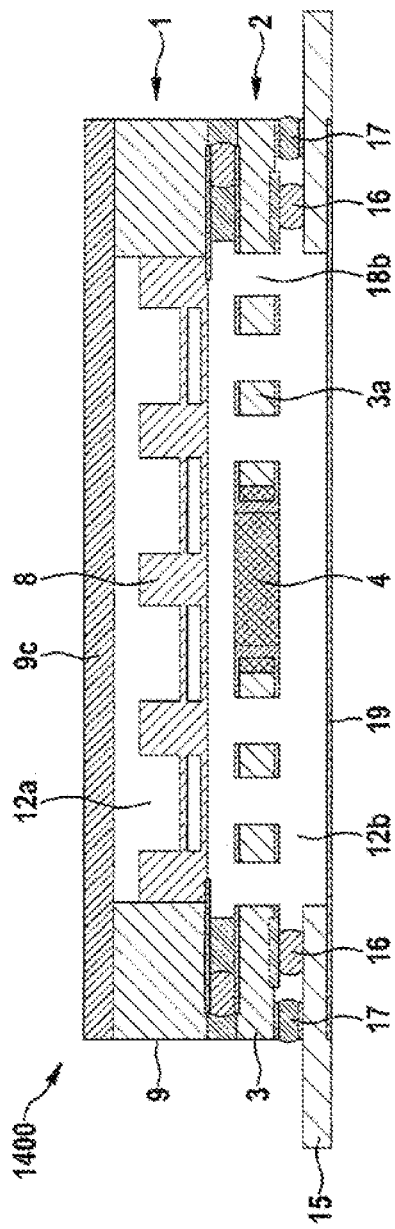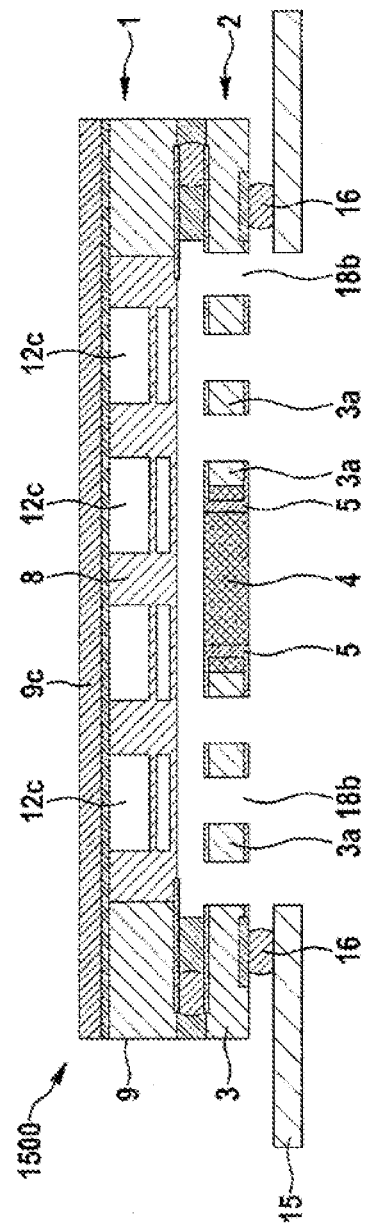

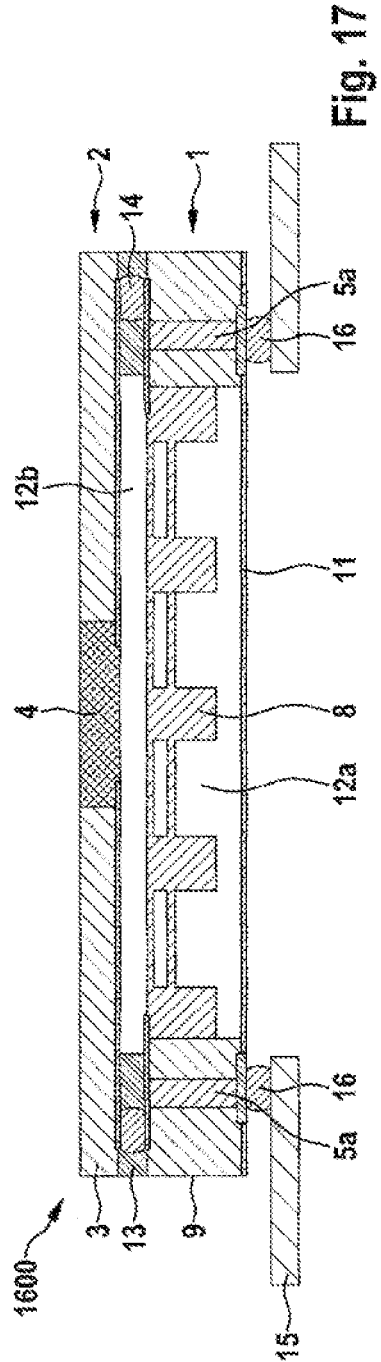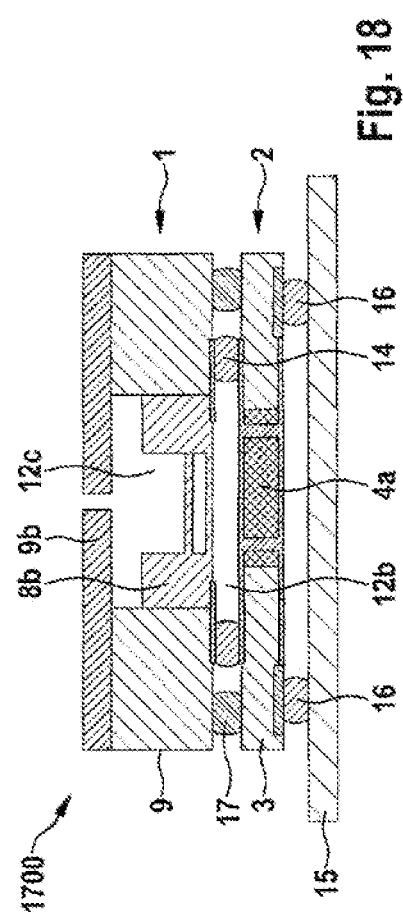

MEMS CHIP PACKAGE AND METHOD FOR MANUFACTURING AN MEMS CHIP PACKAGE

This application claims priority under 35 U.S.C. §119 to patent application No. DE 10 2011 086 764.3 filed on Nov. 22, 2011 in Germany, the disclosure of which is incorporated herein by reference in its entirety

BACKGROUND

The disclosure relates to an MEMS chip package and to a method for manufacturing an MEMS chip package.

Chips having microelectromechanical structures (MEMS chips) are usually installed together with control chips in a shared chip package. Particularly in the case of MEMS chips having audio elements, such as microphones or loudspeakers, it is necessary to make allowance for acoustic circumstances in a small installation space. To this end, it is necessary to provide appropriate front and back volumes, accesses to the acoustically active diaphragm and also, possibly acoustically transparent chip components.

One particular challenge of manufacturing MEMS chips having microelectromechanical loudspeaker elements (MEMS loudspeakers) is the size or chip area of such MEMS chips.

The document DE 10 2009 042 191 A1 discloses a chip package encapsulated at wafer level having an MEMS element and an ASIC chip.

The document U.S. Pat. No. 7,550,828 B2 discloses a semiconductor package having an MEMS microphone chip and a control chip on a semiconductor substrate.

There is a need for packages for MEMS chips having acoustically active elements and the control chips therefor which firstly takes account of the acoustic constraints but secondly is able to provide mechanical protection for the elements and the chips in a small installation space while being inexpensive to produce.

SUMMARY

According to one aspect, the present disclosure provides an MEMS chip package, having a first chip having a first chip surface and a second chip surface, which is opposite the first chip surface, a second chip having a first chip surface and a second chip surface, which is opposite the first chip surface, a first coupling element, which couples the first chip surface of the second chip to the first chip surface of the first chip, so that a first cavity is produced between the first chip and the second chip, and a first redistribution layer, which is mounted on the second chip surface of the second chip and which is designed to provide contact with a substrate. In this arrangement, one of the two chips has at least one microelectromechanical structure element which is produced on the first chip surface, and a frame element, produced between the first and second chip surfaces, which encloses the microelectromechanical structure element. The respective other chip has a potting compound layer, a control circuit which is embedded in the potting compound layer and which is designed to drive the at least one microelectromechanical structure element, and a third redistribution layer, which is mounted on the first chip surface.

According to a further aspect, the present disclosure provides a method for manufacturing an MEMS chip package, having the step of coupling a first chip, which has a first chip surface and a second chip surface, which is opposite the first chip surface, to a second chip, which has a first chip surface and a second chip surface, which is opposite the first chip surface, by means of a coupling element which couples the first chip surface of the second chip to the first chip surface of the first chip, so that a first cavity is produced between the first chip and the second chip, wherein a chip from the group comprising the first and second chips has: at least one microelectromechanical structure element which is produced on the first chip surface, and a frame element, produced between the first and second chip surfaces, which encloses the microelectromechanical structure element, and wherein the respective other chip from the group comprising the first and second chips has: a potting compound layer, a control circuit which is embedded in the potting compound layer and which is designed to drive the at least one microelectromechanical structure element, and a third redistribution layer, which is mounted on the first chip surface.

It is a concept of the present disclosure to provide a chip package in which a composite stack comprising an MEMS chip and a repackaged control chip is mounted on a substrate. In this arrangement, the electrical connections between the two chips and the substrate are formed by means of plated-through holes in one of the two chips and metalized redistribution layers on the chip surfaces. Furthermore, the two chips are coupled by a coupling element such that a cavity is produced between the two chips. This cavity produces an acoustic front or back volume for an acoustically active MEMS structure element in one of the two chips.

The composite stacking of the chip package advantageously reduces the necessary base area for the chip package in comparison with conventional side-by-side constructions.

A further advantage is that the MEMS structure elements can be produced in the chips independently of the electrical coupling of the MEMS chip to the control chip and/or to the substrate. As a result, it is possible for the fragile MEMS structure elements to be processed more easily and in a manner customized to MEMS production.

Elements of the chips can be capped at chip level already, so that there is no longer any need for further complex and space-intensive capping steps after the chips have been mounted on the substrate.

During the actual production of the individual chips, it is possible to save material, since the chips fabricated to completion at chip level mean that there is no longer any need for a safety interval from the edge or a space reserve for mounting further capping components.

Most chip production processes, particularly the mounting of the covering layer, can advantageously take place in batch processes, which saves time and costs during manufacture.

The composite levels are furthermore produced without a substrate and usually without any additional potting compound coatings, which means that no or almost no thermomechanical stress can act on the chips.

According to one embodiment, the chip having the microelectromechanical structure element may also have a first covering layer, which is mounted on the second chip surface on the frame element, wherein at least one second cavity is produced between the first covering layer and the at least one microelectromechanical structure element.

According to one embodiment, the chip having the microelectromechanical structure element may also have a second redistribution layer, which is produced on the first chip surface.

According to one embodiment, the second chip may have at least one electrical plated-through hole running between the first and second chip surfaces.

According to one embodiment, the first chip surface of the second chip and the first chip surface of the first chip may have an essentially congruent area. This affords the advantage that the coupling of physical sizes when stacking the first and second chips is reduced. In addition, it is not necessary to fit any additional spacers.

According to a further embodiment, the first coupling element may have an element from the group comprising an underfill material, a sealing ring made of solder material, FC contacts, such as copper pillars or gold stud bumps, or combinations thereof. This affords the advantage that the cavity between the first and second chips can be produced easily, inexpensively and with predefined cavity properties when the chips are actually stacked.

According to a further embodiment, the at least one microelectromechanical structure element may have a microelectromechanical loudspeaker element or a microelectromechanical microphone element. Particularly for acoustically active elements such as MEMS loudspeakers, MEMS loudspeaker arrays or MEMS microphones, the chip package topology according to the disclosure is suitable, since appropriate acoustic cavities and accesses can be provided in the chip package easily, inexpensively, in a space-saving fashion and flexibly.

According to a further embodiment, the first covering layer may be acoustically transparent, that is to say essentially permeable to soundwaves. This advantageously makes it possible to provide a cavity which firstly has an acoustic channel to the outside world but secondly is protected against disruptive environmental influences, such as particle entry, mechanical strain or the like. This is particularly advantageous in the case of acoustically active MEMS elements such as diaphragms or moving MEMS components.

According to a further embodiment, the first covering layer may be coupled to the at least one microelectromechanical structure element and may produce a multiplicity of second cavities. This means that individual acoustic volumes can be provided which, particularly for MEMS loudspeaker arrays, can afford advantages in terms of sound quality and driving.

According to a further embodiment, a second covering layer may be provided which is arranged on the first covering layer. According to one preferred embodiment, for example, this may be acoustically nontransparent, and may also have at least one passage hole. This allows a dimensionally stable second covering layer to be chosen which can protect the MEMS chip against external mechanical influences even better.

According to a further embodiment, a third covering layer may be provided which is arranged on the second chip surface of the chip with the control circuit or on a surface of the substrate. In this case, according to one preferred embodiment, the substrate may have a cutout in the region of the second chip, and the second chip may have at least one passage hole. This advantageously allows acoustic access from the reverse of the MEMS chip through the substrate.

According to one embodiment of the method, it is possible for a first redistribution layer, which is mounted on the second chip surface of the second chip, to be coupled to a substrate.

According to a further embodiment of the method, the chip having the microelectromechanical structure element may also have a first covering layer, which is mounted on the second chip surface on the frame element, wherein at least one second cavity is produced between the first covering layer and the at least one microelectromechanical structure element.

Further features and advantages of embodiments of the disclosure are revealed by the description below with reference to the appended drawings.

BRIEF DESCRIPTION OF THE DRAWINGS

In the drawings:

FIG. 1 shows a schematic illustration of an MEMS chip and a control chip according to one embodiment of the disclosure;

FIG. 2 shows a schematic illustration of an MEMS chip package according to a further embodiment of the disclosure;

FIG. 3 shows a schematic illustration of an MEMS chip package according to a further embodiment of the disclosure;

FIG. 4 shows a schematic illustration of an MEMS chip package according to a further embodiment of the disclosure;

FIG. 5 shows a schematic illustration of an MEMS chip package according to a further embodiment of the disclosure;

FIG. 6 shows a schematic illustration of an MEMS chip package according to a further embodiment of the disclosure;

FIG. 7 shows a schematic illustration of an MEMS chip package according to a further embodiment of the disclosure;

FIG. 8 shows a schematic illustration of an MEMS chip package according to a further embodiment of the disclosure;

FIG. 9 shows a schematic illustration of an MEMS chip package according to a further embodiment of the disclosure;

FIG. 10 shows a schematic illustration of an MEMS chip package according to a further embodiment of the disclosure;

FIG. 11 shows a schematic illustration of an MEMS chip package according to a further embodiment of the disclosure;

FIG. 12 shows a schematic illustration of an MEMS chip package according to a further embodiment of the disclosure;

FIG. 13 shows a schematic illustration of an MEMS chip package according to a further embodiment of the disclosure;

FIG. 14 shows a schematic illustration of an MEMS chip package according to a further embodiment of the disclosure;

FIG. 15 shows a schematic illustration of an MEMS chip package according to a further embodiment of the disclosure;

FIG. 16 shows a schematic illustration of an MEMS chip package according to a further embodiment of the disclosure;

FIG. 17 shows a schematic illustration of an MEMS chip package according to a further embodiment of the disclosure;

FIG. 18 shows a schematic illustration of an MEMS chip package according to a further embodiment of the disclosure.

DETAILED DESCRIPTION

Figure 19:
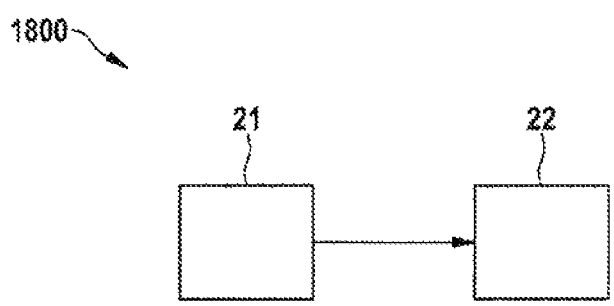
FIG. 19 shows a schematic illustration of a method for manufacturing an MEMS chip package according to a further embodiment of the disclosure.

FIG. 1 shows a schematic illustration of a chip 1 having microelectromechanical structure elements (MEMS chip) and also a control chip component 2. The MEMS chip 1 in this arrangement has one or more microelectromechanical structure elements 8 (MEMS elements). By way of example, the MEMS elements 8 may have microelectromechanical loudspeaker elements, microelectromechanical microphone elements or other microelectromechanically produced components. By way of example, the MEMS elements 8 may be produced in a two-dimensional grid in order to provide an MEMS loudspeaker array comprising individual pixels.

In this arrangement the MEMS elements 8 may be surrounded by a frame element 9, which may have a potting compound material or molding material, for example. In this case, the MEMS chips 1 can be produced in what is known as a "molded wafer level packaging", that is to say in a production process for repackaging chips at wafer lever. This involves the MEMS elements 8 being mounted on a sacrificial support, having potting compound cast around them, being cured and being removed from the sacrificial support as a cast wafer. The resultant potting compound wafer, what is known as the "reconfigured wafer", can then be processed further and singularized, in particular in singularization processes, to produce corresponding chips, such as the MEMS chip 1.

The MEMS chip 1 has a first chip surface, shown facing upward in FIG. 1, on which the MEMS elements 8 are arranged. By way of example, the first chip surface may have a redistribution layer or metallization layer 10 which is designed to produce electrical contacts for the MEMS elements 8. On a second chip surface, arranged opposite the first chip surface, the MEMS chip 1 may be open, that is to say that the MEMS elements 8 are exposed for external access.

The control chip component 2 may be a repackaged chip, that is to say a chip 2 made of a potting compound or molding material 3 which may have been produced using a "molded wafer level packaging" process. In this regard, a control circuit 4 may be embedded in a potting compound layer 3, for example in a central region of the potting compound layer 3. In this arrangement, the potting compound layer 3 may have essentially the same thickness as the control circuit 4, so that the potting compound layer 3 has uniform chip surfaces together with the control circuit 4. A first chip surface, shown at the bottom in FIG. 1, may have a first redistribution layer or metallization layer 6a mounted on it. A second chip surface, which is opposite the first chip surface, may have a second redistribution layer or metallization layer 6b provided on it. In addition, the second chip surface may have contact pads 7b produced on it which can be used to make electrical contact between the control chip component 2 and an underlying substrate.

The control circuit 4 may for its part be integrated in a control chip which, by way of example, has one or more plated-through holes 5 which can electrically connect the first metallization layer 6a on the first chip surface to the second metallization layer 6b on the second chip surface.

FIG. 2 shows a schematic illustration of an MEMS chip package 100. For manufacture of the MEMS chip package 100, a first chip surface of a MEMS chip 1 is coupled by means of at least one coupling element 13 to the first chip surface of a control chip component 2. By way of example, the coupling element 13 may be underfill material which is arranged around solder contacts 14 between the redistribution layer 10 of the MEMS chip 1 and the redistribution layer 6a of the control chip component 2. In this case, the coupling element 13 is arranged such that a cavity 12b is produced between the MEMS chip 1 and the control chip component 2. By way of example, the underfill material may be an epoxy adhesive. By way of example, the solder contacts 14 may be solder beads, solder bumps, stud bumps or what are known as copper pillars, cylindrical copper pillars with caps made of solder material. The coupling element may likewise have FC contacts, such as copper pillars or gold stud bumps.

That chip surface of the MEMS chip 1 which is remote from the control chip component 2 may have a covering layer 11 arranged on it which is connected to the frame element 9 and which provides a cavity 12a between the MEMS elements 8 and the covering layer 11. In particular, the cavity 12a may be suitable for MEMS loudspeaker elements 8 in order to provide an acoustically active cavity 12a. The covering layer 11 may be acoustically transparent, that is to say permeable or essentially permeable to sound wave propagation. By way of example, the covering layer 11 may have a film, for example, made of Mylar® or Hostaphan®, a fine metal lattice, a plastic lattice, a filter layer or a similar layer. By way of example, the covering layer 11 can be laminated, bonded or fused onto the MEMS chips 11 in a batch process.

As shown schematically in FIG. 3, the MEMS chip package 100 from FIG. 2 can be mounted on a substrate 15. To this end, that chip surface of the control chip component 2 which is remote from the MEMS chip 1 can be provided with solder contacts 16, such as solder beads, solder bumps, stud bumps or copper pillars, for example on the contact pads 7b, in order to electrically couple the redistribution layer 6b of the control chip component 2 to a metallization (not shown) on the substrate 15. In this case, the substrate 15 may comprise a PCB, an LGA substrate, a BGA substrate, a PGA substrate or a similar support layer, for example.

The MEMS chip 1, the control chip component 2 and the substrate 15 may in this case form an MEMS chip package 200 which has the lateral dimensions of one of the chips 1 or 2. In this regard, it may be advantageous to make the MEMS chip 1 and the control chip component 2 similar in terms of chip area, that is to say that the areas of the chip surfaces of the respective chips 1 and 2 are the same or essentially the same. This makes it possible to provide a chip scale package (CSP) which requires little lateral installation space and in which the coupling of physical sizes between the MEMS chip 1 and the control chip component 2 is simplified on account of the chip area of the control chip component 2 being increased by the potting compound layer 3. The covering layer 11 means that additional capping of the MEMS chip package 200 is not necessary, particularly because the cavity 12b is already acoustically sealed by the two chips 1 and 2 themselves and also by the coupling element 14.

FIGS. 4 to 16 show schematic illustrations of possible exemplary embodiments of MEMS chip packages 300, 400, 500, 600, 700, 800, 900, 1000, 1100, 1200, 1300, 1400 and 1500, the variant embodiments and specific refinement features of which can be combined or modified with any of the other chip packages. A common feature of the MEMS chip packages shown in these figures is that the MEMS chip 1 is coupled to the control chip component 2 on a chip surface to chip surface basis, and that the control chip component 2 is coupled to a substrate 15 by means of solder contacts 16, as shown schematically in FIG. 3 and explained further above. The text below therefore explains only the differing refinement features of the chip packages in each case.

To increase the composite robustness, the MEMS elements 8 can be partially surrounded by potting material projections 9a in the MEMS chip package 300, for example.

If the frame element 9 terminates in planar fashion with the MEMS elements 8 at the chip surface, it may be possible for the MEMS chip package 400 to contain the covering layer 11 arranged such that it is connected to the MEMS elements 8 or to portions of the MEMS elements 8. This allows individual cavities 12c to be produced between individual MEMS elements 8, for example MEMS loudspeaker pixels in an MEMS loudspeaker array. If the covering layer 11 is acoustically transparent, this can help to improve the driving or sound quality of the MEMS loudspeaker array.

It is also possible for the plated-though holes 5 in the MEMS chip package 500 not to be arranged in the control chip 4, but rather for the plated-through holes to be formed in the potting compound layer 3.

For the MEMS chip package 600, the coupling elements used are sealing rings 17, for example made of solder material, instead of the underfill material 14. This makes it possible to terminate the cavity 12b around the circumference of the area of the MEMS elements 8 so that it is acoustically impermeable. In this case, it may advantageous that the sealing rings 17 are less inclined to melt on account of the wetting properties. This allows better adjustment of the acoustic properties of the cavity 12b. In this case, the sealing rings 17 can be mounted outside the solder contacts 14, for example.

In the MEMS chip package 700, the frame element 8a and the MEMS elements 8 are produced in integral form, for example from a micromechanically structured semiconductor material, such as silicon. This can entail advantages in production, since thermomechanical stresses at the boundary between potting compound and MEMS elements 8 can no longer arise.

In the MEMS chip packages 800 to 1100 in FIGS. 9 to 12, further covering layers 9b are respectively mounted on the chip surface which is remote from the control chip component 2. By way of example, the further covering layers 9b can be produced from the same potting compound material as the frame element 9 or from plastic. In this case, the covering layer 9b can produce a cover having mechanical dimensional stability which may have one or more passage holes 18a. The passage holes 18a can provide an acoustic access or channel to the underlying cavity 12a or the underlying cavities 12c. In this case, the second covering layer 9b may be arranged on or beneath the first covering layer 11, and may be bonded, laminated, fused or welded on the first covering layer 11 or the frame element 9. In this context, the first covering layer 11 may for its part be used as an adhesive layer or for tolerance compensation.

In the case of the MEMS chip packages 1200 to 1500 in FIGS. 13 to 16, provision may be made for the potting compound layer 3 of the control chip component 2 to have one or more passage holes 18b which can provide acoustic access to the cavity 12b. By way of example, this may be advantageous when a covering layer 9c on the chip surface which is remote from the control chip component 3 is acoustically impermeable, that is to say is impermeable or essentially impermeable to soundwaves. In this case, the covering layer 9c may be a full-area cover, for example made of potting compound or plastic. As a result, the cavity 12a or the cavities 12c may be sealed in acoustically impermeable fashion.

In this arrangement, the potting compound layer 3 may have individual compound layer components 3a between which there are acoustic accesses 18b to the cavity 12b. At the same time, the substrate 15 may have an opening via which the acoustic accesses 18b can be connected to the outside world. By way of example, the MEMS chip package 1300 may have provision for a third covering layer 19 to be provided, which is mounted as an acoustic window on that chip surface of the control chip component 2 which is remote from the MEMS chip 1. Alternatively, it may be possible in the MEMS chip package 1400 for the third covering layer 19 to be mounted on the underside of the substrate 15 and for the cavity 12b defined by the substrate 15, the control chip component 2 and the underside of the MEMS chip 1 to be acoustically sealed by means of sealing rings 17 between the control chip component 2 and the substrate 15. In this arrangement, the sealing rings 17 of the MEMS chip package 1400 may correspond to the sealing rings 17 explained further above in connection with the MEMS chip package 600.

For MEMS loudspeaker elements in an MEMS loudspeaker array 8, as shown with reference to the MEMS chip package 1500, it may be advantageous to mount the acoustically impermeable cover 9c so as to be directly connected to the MEMS elements 8, as a result of which individual cavities 12c are produced.

FIG. 17 shows a schematic illustration of an MEMS chip package 1600. The MEMS chip package 1600 in FIG. 17 differs from the other MEMS chip packages in FIGS. 1 to 16 essentially in that instead of the control chip component 2 the MEMS chip 1 is coupled to the substrate 15 by means of solder contacts 16. Therefore, the control chip component 3 has no further plated-through holes 5. Instead, the frame element 9 has plated-through holes 5a formed through the MEMS chip 1 which provide electrical contact with the metallization layer 6a of the control chip component 2. The substrate 15 has an opening which provides an acoustic access to the covering layer 11, which may be acoustically transparent, for example, in the case of MEMS loudspeaker elements 8.

FIG. 18 shows a schematic illustration of an MEMS chip package 1700. The MEMS chip package 1700 in FIG. 18 differs from the other MEMS chip packages in FIGS. 1 to 16 essentially in that the MEMS element 8 is a single MEMS microphone element 8b which is acoustically connected to the outside world via a passage hole in a covering layer 9b. In this case, the control chip 4a in the control chip component 2a is designed to drive the MEMS microphone element 8b as appropriate. It should be clear in this context that the variant embodiments and exemplary refinements explained in connection with FIGS. 1 to 17 can also be used in equal measure for the MEMS chip package 1700 in FIG. 18.

FIG. 19 shows a schematic illustration of a method 1800 for manufacturing an MEMS chip package, particularly one of the MEMS chip packages 100, 200, 300, 400, 500, 600, 700, 800, 900, 1000, 1100, 1200, 1300, 1400, 1500, 1600 or 1700. As a first step 21, the method 1800 comprises coupling a first chip, which has a first chip surface and a second chip surface, opposite the first chip surface, to a second chip, which has a first chip surface, a second chip surface, opposite the first chip surface, and at least one electrical plated-through hole running between the first and second chip surfaces, by means of a coupling element which couples the first chip surface of the second chip to the first chip surface of the first chip, so that a first cavity is produced between the first chip and the second chip. In a second step 22, a first redistribution layer, which is mounted on the second chip surface of the second chip, is coupled to a substrate. In this case, a chip from the group comprising the first and second chips has at least one microelectromechanical structure element which is produced on the first chip surface, a second redistribution layer, produced on the first chip surface, a frame element which is produced between the first and second chip surfaces and which encloses the microelectromechanical structure element, and a first covering layer, which is mounted on the second chip surface on the frame element, wherein at least one second cavity is produced between the first covering layer and the at least one microelectromechanical structure element. In this arrangement, the respective other chip from the group comprising the first and second chips has a potting compound layer, a control circuit which is embedded in the potting compound layer and which is designed to drive the at least one microelectromechanical structure element, and a third redistribution layer, which is mounted on the first chip surface.

What is claimed is:

1. A MEMS chip package, comprising:
   a first chip having a first chip surface and a second chip surface, which is opposite the first chip surface of the first chip;
   a second chip having a first chip surface and a second chip surface, which is opposite the first chip surface of the second chip;
   a first coupling element, which couples the first chip surface of the second chip to the first chip surface of the first chip, so that a first cavity is defined between the first chip and the second chip; and
   a first redistribution layer, which is mounted on the second chip surface of the second chip and which is configured to provide contact with a substrate,
   wherein one chip of the first chip and the second chip has (i) at least one microelectromechanical structure (MEMS) element which is produced on the first chip surface of said one chip, and (ii) a frame element, produced between the first chip surface and the second chip surface of said one chip, which encloses the at least one microelectromechanical structure (MEMS) element, and wherein the other chip of the first chip and second chip has (i) a potting compound layer, (ii) a control circuit, embedded in the potting compound layer, which is configured to drive the at least one microelectromechanical structure element, and (iii) a third redistribution layer, which is mounted on the first chip surface of said other chip.

2. The MEMS chip package according to claim 1, said one chip having the microelectromechanical structure element also has (i) a first covering layer, mounted on the frame element, and (ii) a second redistribution layer, produced on the first chip surface of said one chip, and at least one second cavity is defined between the first covering layer and the at least one microelectromechanical structure element.

3. The MEMS chip package according to claim 1, wherein:

the first chip surface of the second chip and the first chip surface of the first chip have an essentially congruent area, and the second chip has at least one electrical plated-through hole running between the first and second chip surfaces of the second chip.

4. The MEMS chip package according to claim 1, wherein the first coupling element has an element from the group comprising an underfill material, an adhesive from a sealing ring made of solder material, FC contacts, or combinations thereof.

5. The MEMS chip package according to claim 1, wherein the at least one microelectromechanical structure element has a microelectromechanical loudspeaker element or a microelectromechanical microphone element.

6. The MEMS chip package according to claim 2, wherein the first covering layer is acoustically transparent.

7. The MEMS chip package according to claim 2, wherein:
the first covering layer is coupled to the at least one microelectromechanical structure element, and
the first covering layer produces a multiplicity of second cavities.

8. The MEMS chip package according to claim 2, further comprising:
a second covering layer, which is arranged on the first covering layer.

9. The MEMS chip package according to claim 8, wherein:
the second covering layer is acoustically nontransparent, and
the second covering layer has at least one passage hole.

10. The MEMS chip package according to claim 1, further comprising:
a third covering layer, which is arranged on the second chip surface of the chip with the control circuit or on a surface of the substrate, and
wherein the substrate is coupled to the first redistribution layer.

11. The MEMS chip package according to claim 10, wherein:
the substrate has a cutout in the region of the second chip, and
the second chip has at least one passage hole.

* * * * *